United States Patent [19]
Garbuzov et al.

[11] Patent Number: 5,874,803
[45] Date of Patent: Feb. 23, 1999

[54] LIGHT EMITTING DEVICE WITH STACK OF OLEDS AND PHOSPHOR DOWNCONVERTER

[75] Inventors: Dmitri Z. Garbuzov; Stephen R. Forrest; Paul Burrows, all of Princeton, N.J.

[73] Assignee: The Trustees of Princeton University, Princeton, N.J.

[21] Appl. No.: 925,403

[22] Filed: Sep. 9, 1997

[51] Int. Cl.$^6$ .................................................. H01J 1/62
[52] U.S. Cl. ................... 313/506; 313/501; 313/503; 313/504
[58] Field of Search ................... 313/501, 503, 313/504, 506, 509, 512, 112

[56] References Cited

U.S. PATENT DOCUMENTS

| | | |
|---|---|---|
| 4,769,292 | 9/1988 | Tang et al. |
| 4,950,950 | 8/1990 | Perry et al. |
| 5,294,870 | 3/1994 | Tang et al. |

FOREIGN PATENT DOCUMENTS

WO 96/19792   6/1996   WIPO.

OTHER PUBLICATIONS

S. W. Depp and W. E. Howard, "Flat Panel Displays," *Scientific American* 90 (Mar. 1993).

D. Z. Garbuzov et al., "Photoluminescence Efficiency and Absorption of Aluminum Tri–Quinolate (Alq$_3$) Thin Films," 249 *Chemical Physics Letters* 433 (1996) no month.

C. E. Johnson et al., "Luminescent Iridium (I), Rhodium (I), and Platinum (II) Dithiolate Complexes," 105 *Journal of the American Chemical Society* 1795 (1983) no month.

Hosokawa et al., "Highly efficient blue electroluminescence from a distrylarylene emitting layer with a new dopant," 67 *Appl. Phys. Lett.* 3853–3855 (Dec. 1995).

Adachi et al., "Blue light–emitting organic electroluminescent devices," 56 *Appl. Phys. Lett.* 799–801 (Feb. 1990).

C. C. Wu et al., "Integrated three–color organic light–emitting devices," 69 *Appl. Phys. Lett.* 3117–3119 (Nov. 1996).

H. Vestweber et al., "Electroluminescense from polymer blends and molecularly doped polymers," 64 *Synthetic Metals,* 141–145 (1994) no month.

Burrows et al., "Color Tunable Organic Light Emitting Devices," 69 *Appl. Phys. Lett.* 2959 (Nov. 11, 1996).

D. Z.Garbuzov et al., "Organic films deposited on Si p–n junctions: Accurate measurements of fluorescence internal efficiency, and application to luminescent antireflection coatings," 80 *J. Appl. Phys.* 4644–4648 (Oct. 1996).

P.E. Burrows et al., "Reliability and degradation of organic light emitting devices," 65 *Appl. Phys. Lett.* 2922–2924 (Dec. 1994).

H. A. MacLeod, *Thin Film Optical Filters,* pp. 94–110 (1969). no month.

Johnson et al., "Electroluminescence from Single Layer Molecularly doped polymer films," 67 *Pure & Appl. Chem.,* 175–182 (1985) no month.

*Primary Examiner*—Vip Patel
*Attorney, Agent, or Firm*—Kenyon & Kenyon

[57] ABSTRACT

Monochromatic and multicolor light emitting devices which make use of phosphor layers to downconvert light emitted from organic light emitting materials into different, more desired colors. The light emitting devices of the present invention are used in a variety of applications to provide displays with high brightnesses and efficiencies.

41 Claims, 5 Drawing Sheets

LIGHT EMITTING DEVICE WITH STACK OF OLEDS AND PHOSPHOR DOWNCONVERTER

GOVERNMENT RIGHTS

FIELD OF THE INVENTION

This invention relates to light emitting devices that use layers of organic light emitting materials and phosphor downconverters to provide monochromatic or multicolor displays.

BACKGROUND OF THE INVENTION

Organic light emitting devices (OLED's), which make use of thin film materials that emit light when excited by electric current, are becoming an increasingly popular form of flat panel display technology for applications such as television sets, computer terminals, telecommunications equipment and a host of other applications. There are presently three predominant types of OLED construction: the "double heterostructure" (DH) OLED, the "single heterostructure" (SH) OLED, and the single layer polymer OLED. In the DH OLED, as shown in FIG. 1A, a substrate layer of glass 10 is coated by a thin layer of indium-tin-oxide (ITO) 11. Next, a thin (100–500 Å) organic hole transporting layer (HTL) 12 is deposited on ITO layer 11. Deposited on the surface of HTL 12 is a thin (typically, 50 Å–500 Å) emission layer (EL) 13. The EL 13 provides the recombination site for electrons injected from a 100–500 Å thick electron transporting layer 14 (ETL) with holes from the HTL 12. Examples of prior art ETL, EL and HTL materials are disclosed in U.S. Pat. No. 5,294,870, the disclosure of which is incorporated herein by reference.

Often, the EL 13 is doped with a highly fluorescent dye to tune color and increase the electroluminescent efficiency of the OLED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs from emissive layer 13 through the glass substrate 10. An LED device of FIG. 1A typically has luminescent external quantum efficiencies of from 0.05% to 2% depending on the color of emission and the device structure.

The SH OLED, as shown in FIG. 1B, makes use of multifunctional layer 13 to serve as both EL and ETL. One limitation of the device of FIG. 1B is that the multifunctional layer 13 must have good electron transport capability. Otherwise, separate EL and ETL layers should be included as shown for the device of FIG. 1A.

A single layer polymer OLED is shown in FIG. 1C. As shown, this device includes a glass substrate 1 coated by a thin ITO layer 3. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg or other conventionally used low work function metal.

OLED materials for the emission of red, green and blue light are known in the art. Conventional red OLEDS, however, are generally inferior to blue and green OLEDs in terms of brightness and efficiency. An example of a multicolor electroluminescent image display device employing organic compounds for light emitting pixels is disclosed in U.S. Pat. No. 5,294,870.

SUMMARY OF THE INVENTION

The present invention provides monochromatic and multicolor light emitting devices with high brightnesses and efficiencies.

The present invention also improves the efficiency of OLEDs, and particularly OLEDs that emit red light.

The present invention provides OLEDs that are capable of emitting a wide variety of colors.

The present invention provides monochromatic and multicolor light emitting devices that make use of phosphor layers to downconvert the color of light emitted from organic light emitting materials into different colors. In one embodiment of the invention, a downconversion layer is used to convert blue or green light emitted from an organic light emitting layer into red light within a stacked arrangement of one or more OLEDs. In another embodiment of the invention, downconversion layers are used to convert blue or green light emitted from one or more organic light emitting layers into green and/or red light. The light emitting devices of the present invention are used in a variety of monochromatic and multicolor applications to provide displays with high brightnesses and efficiencies.

DETAILED DESCRIPTION

The present invention provides light emitting devices that make use of downconversion phosphor layers to provide displays of high efficiency and brightness. A light emitting device in accordance with the present invention comprises a plurality of organic light emitting layers in a stacked arrangement and a downconversion phosphor layer disposed between any two of the plurality of organic light emitting layers. In another aspect of the invention, a light emitting device of the present invention comprises an organic light emitting layer, a downconversion phosphor layer, and a filter structure for allowing the passage of only certain wavelengths. The invention is further described with reference to the non-limiting embodiments which follow.

Figure 1A:
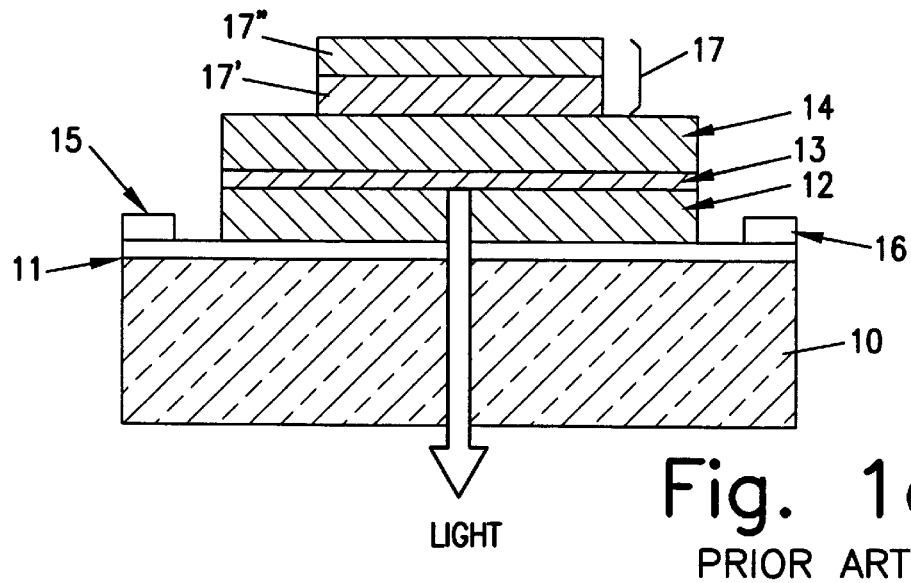
FIG. 1A is a cross sectional view of a typical organic double heterostructure light emitting device (OLED) according to the prior art.
Figure 1B:
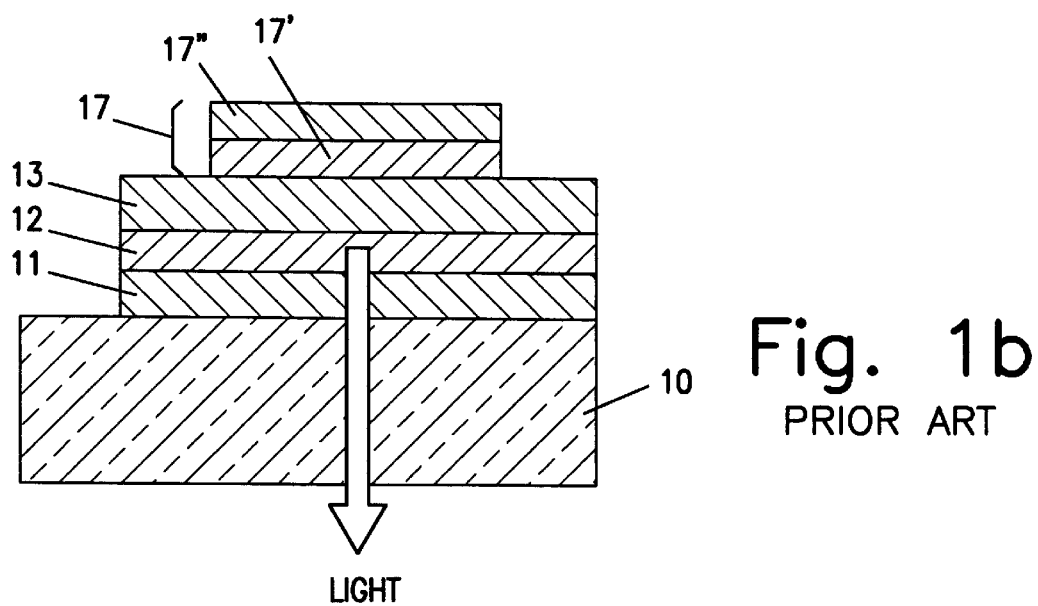
FIG. 1B is a cross sectional view of a typical organic single heterostructure light emitting device (LED) according to the prior art.
Figure 1C:
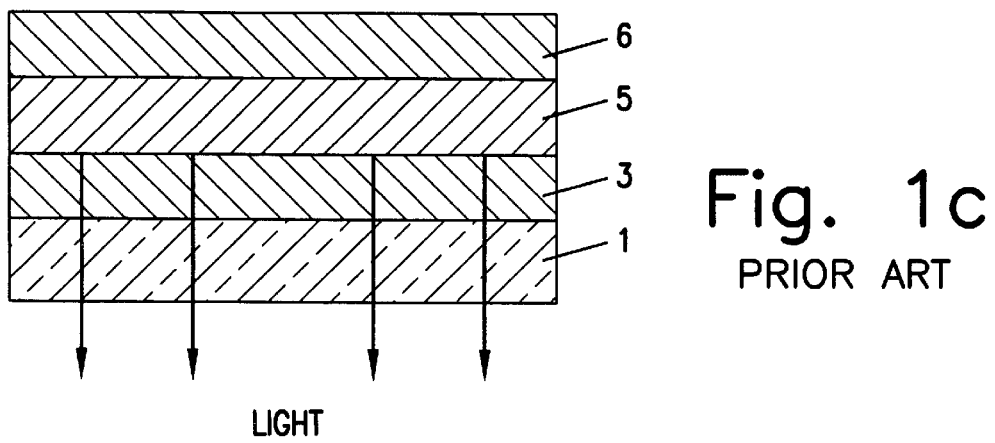
FIG. 1C is a cross sectional view of a known single layer polymer LED structure according to the prior art.
Figure 2:
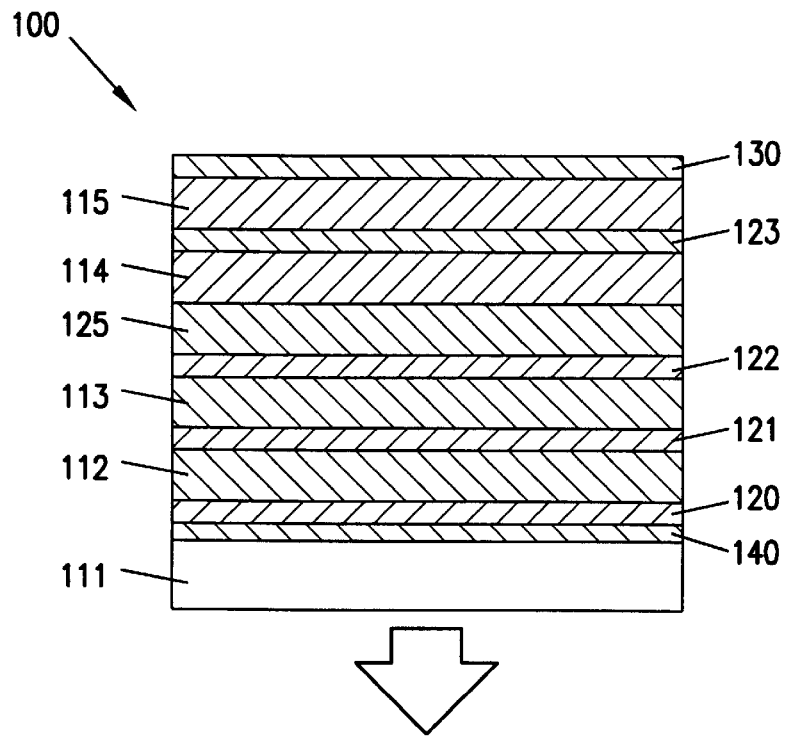
FIG. 2 is a cross sectional view of a stacked light emitting device, in accordance with a first embodiment of the present invention.

In a first embodiment of the present invention, a light emitting device 100 is provided as shown in FIG. 2. In this stacked arrangement of organic light emitting layers, a first blue light emitting layer 112 is provided over substrate 111, green light emitting layer 113 is provided over first blue light emitting layer 112, red downconversion phosphor layer 114 is provided over green light emitting layer 113, and second blue light emitting layer 115 is provided over downconversion phosphor layer 114. Disposed between the light emitting layers are transparent, conductive layers 120, 121, 122 and 123. Metal contact layer 130 is provided over second blue light emitting layer 115.

Disposed between green light emitting layer 113 and red downconversion phosphor layer 114 is a filter structure 125, which is preferably a multilayer stack of one or more dielectric materials. Filter structure 125 shown in FIG. 2 is characterized by a red pass-band and blue and green blocking bands to prevent the pumping of red downconversion phosphor layer 114 by green and blue light emitting layers, 113 and 112, respectively. By reflecting green and blue light, filter structure 125 also serves to increase device efficiency at these wavelengths. Moreover, filter structure 125 results in "multi-pass" pumping of red downconversion phosphor layer 114 by second blue light emitting layer 115, which increases efficiency such that layer 114 is much less thick than is necessary for a single-pass device. For example, red downconversion phosphor layer 114 is as thin as 1000 Å or less.

Filter structure 125 is any suitable material to permit the passage of red light but block the passage of green and blue light, as is known in the art. For example, filter structure 125 comprises at least two dielectric materials with different dielectric constants arranged in a multilayer stack. The thickness and refractive indices of the layers in the stack define the range of wavelengths that are permitted to pass through the structure. Typical inorganic dielectric materials to form filter structure 125 include $SiO_2/TiO_2$ and $SiO_2/SiN_x$. Although such inorganic materials are within the scope of the present invention, the use of organic dielectric materials such as 3, 5, 7, 8 naphthalene tetracarboxylic dianhydride ("NTCDA") and polytetrafluoroethylene (TEFLON) are preferred. The low evaporation temperature organic dielectric materials minimizes the risk of damaging the organic light emitting materials during deposition of the dielectric materials used for filter structure 125.

As is known in the art, light emitting layers 112, 113 and 115 are made from organic materials that emit light when excited by electric current. Therefore, the light emitting device shown in FIG. 2 will emit blue light when a voltage is applied across conductive layers 120 and 121, and green light when voltage is applied between conductive layers 121 and 122. To emit red light, a voltage is applied between conductive layer 123 and metal contact layer 130 so that second blue light emitting layer 115 emits blue light, which is then converted to red light by red downconversion phosphor layer 114. Blue light emitted from second blue light emitting layer 115 is not permitted to pass through filter structure 125 and therefore resonates between layers 125 and 130 to the extent that it is not converted to red light by phosphor layer 114, thereby resulting in the efficient pumping of red downconversion phosphor layer 114. The resulting emission of red light passes through light emitting layers 113 and 112 and into substrate 111. The configuration shown in FIG. 2 permits the more efficient emission of red light than is possible with the use of red organic light emitting layers.

In the embodiment shown in FIG. 2, substrate 111 is a substantially transparent material, such as glass, quartz, sapphire or plastic. For simplicity, the light emitting layers 112, 113 and 115 are shown as single layers in the drawing. As is well-known in the art, however, these layers actually comprise multiple sublayers (e.g., HTL'S, EL's and ETL's) when they are not single-layer polymer devices. The arrangement of the sublayers obviously depends on whether the device is of DH or SH configuration.

Where a transparent, conductive layer serves as both cathode for one light emitting layer and anode for another, such as layer 121, or solely as a cathode, such as layer 122, it preferably comprises a compound electrode such as a semi-transparent low work function metal and ITO. An anode layer that does not also serve as a cathode, however, is preferably ITO. Metal contact layer 130 comprises any suitable material, such as magnesium, lithium, aluminum, silver, gold and alloys thereof.

Figure 3:
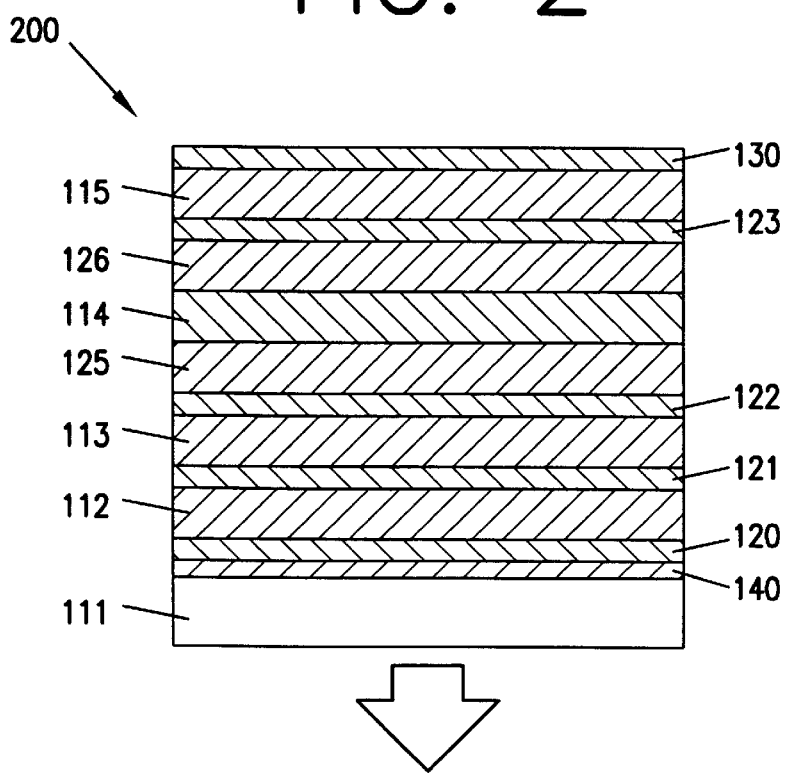
FIG. 3 is a cross sectional view of a stacked light emitting device, in accordance with a second embodiment of the present invention.

In another embodiment of the invention, device 200 comprises a green downconversion phosphor layer 126 inserted between red downconversion phosphor layer 114 and second blue light emitting layer 115, as shown in FIG. 3. Layer 126 results in the more efficient conversion of blue to red light by the intermediate conversion of blue to green light by green downconversion phosphor layer 126. Alternatively, a green light emitting layer is used in place of second blue light emitting layer 115, although a blue light emitting layer is generally preferred as a driver for pumping downconversion phosphor layer 114.

Figure 4:
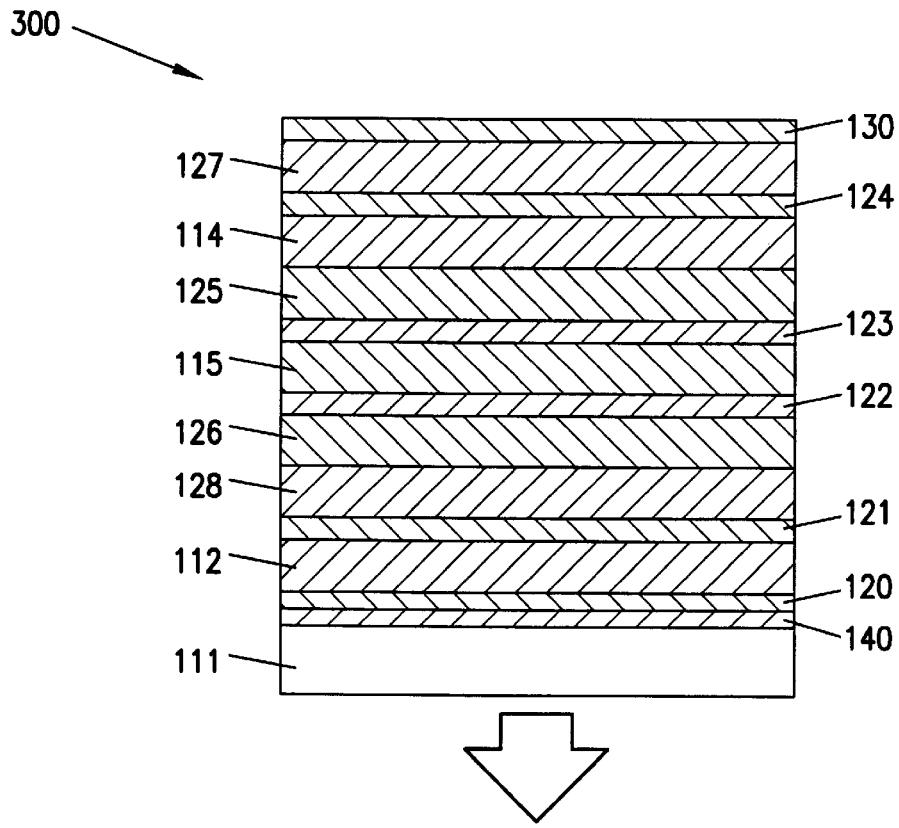
FIG. 4 is a cross sectional view of a stacked light emitting device, in accordance with a third embodiment of the present invention.

In another embodiment of the invention, blue light emitting layers are used to pump both red and green downconversion phosphor layers, as shown in FIG. 4. In device 300, a first blue light emitting layer 112 is provided over substrate 111, green downconversion phosphor layer 126 is provided over first blue light emitting layer 112, second blue light emitting layer 115 is provided over green downconversion layer 126, red downconversion phosphor layer 114 is provided over second blue light emitting layer 115, and third blue light emitting layer 127 is provided over red downconversion phosphor layer 114. Disposed between the light emitting layers are transparent, conductive layers 120, 121, 122, 123 and 124. Metal contact layer 130 is provided over third blue light emitting layer 127. In addition, first and second filter structures 128 and 125, respectively, are disposed between first blue light emitting layer 112 and green downconversion layer 126, and between second blue light emitting layer 115 and red downconversion phosphor layer 114, respectively. First filter structure 128 permits the passage of red and green light while blocking the passage of blue light. Second filter structure 125 permits the passage of red light while blocking the passage of green and blue light.

Figure 5:
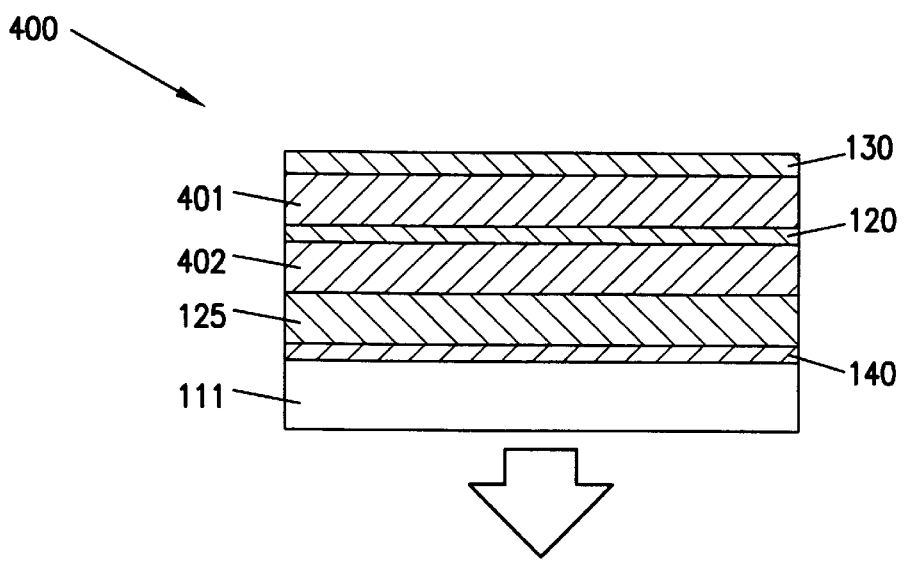
FIG. 5 is a cross sectional view of a single OLED light emitting device, in accordance with a fourth embodiment of the present invention.

In yet another embodiment of the present invention as shown in FIG. 5, device 400 comprises substrate 111, single OLED layer 401, at least one downconversion phosphor layer 402, and filter structure 125. OLED layer 401 is used to pump phosphor layer 402, and filter structure 125 allows the passage of light emitted by phosphor layer 402 while blocking substantially all other colors. Device 400 is preferred for monochromatic applications. Preferably, OLED layer 401 emits blue light, and downconversion phosphor layer 402 emits light of a preferred color such as, for example, red. The use of filter structure 125 results in the efficient pumping of phosphor layer 402 by OLED layer 401, as previously discussed.

The light emitting devices of the present invention optionally comprises a layer 140 of low-loss, high refractive index dielectric material, such as titanium dioxide ("TiO$_2$"), between transparent conductive layer 120 and substrate 111. Layer 140 is especially preferred when transparent, conductive layer 120 is made from ITO, which is a high-loss material. The refractive indexes for TiO$_2$ and ITO are approximately 2.6 and 2.2, respectively. Layer 140 therefore substantially eliminates waveguiding and absorption in the ITO, the light emitted from light emitting layers 112, 113 and 115 now being easily transmitted through layer 140 and substrate 111.

Figure 6:
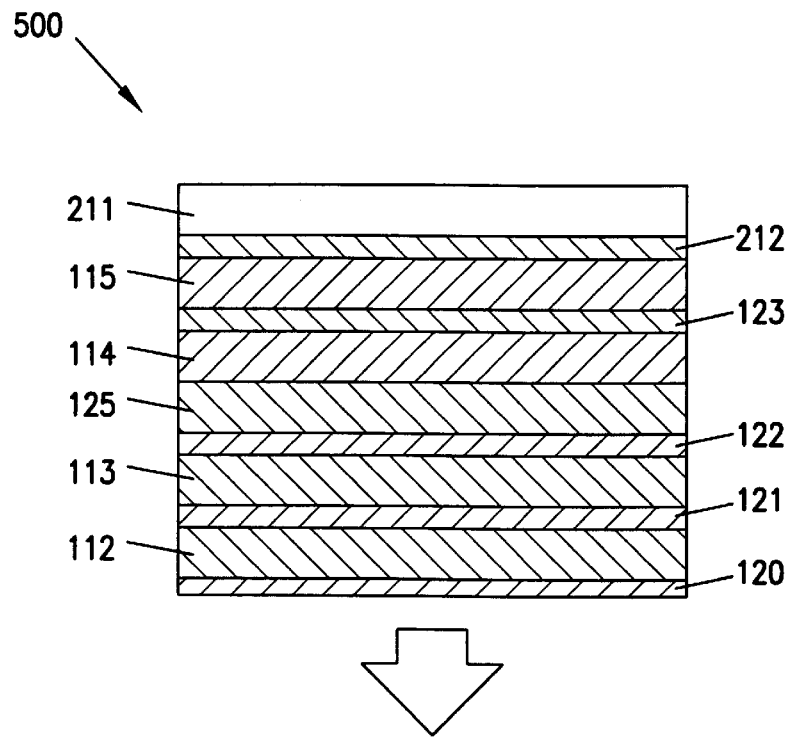
FIG. 6 is a cross sectional view of an inverted stacked light emitting device, in accordance with an embodiment of the present invention.

The present invention includes "inverted" OLED structures, such as the embodiment shown in FIG. 6. In inverted structure 500, the device shown in FIG. 2 is deposited onto substrate 211 such that the light emitted from the device is reflected in a direction away from substrate 211. Substrate 211 is made of a reflective material, or alternatively, a layer of reflective metallization 212 is deposited over substrate 211. Substrate 211 is a metal foil, plastic layer, or other suitable substrate material. If used, reflective metallization layer 212 is any suitable material, such as Al, Ag or Au, for example. The embodiments shown in FIGS. 3 and 4 are likewise arrangeable in an inverted configuration.

The inverted devices of the present invention are generally applicable to devices having opaque substrates, such as when integrating with an active matrix transistor back plate. The inverted devices of the present invention have the additional benefit of being applicable to very high aperture ratio displays.

Figure 7:
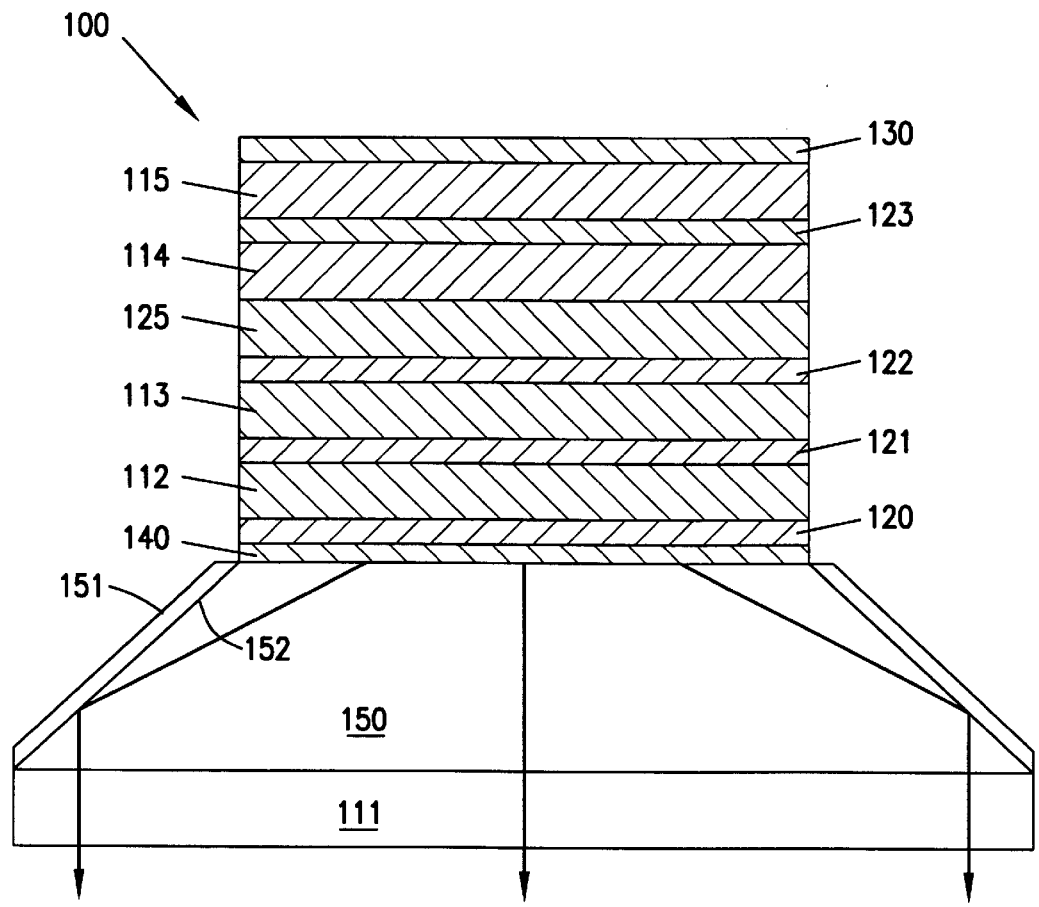
FIG. 7 is a cross sectional view of a stacked light emitting device including a mesa structure, in accordance with an embodiment of the present invention.

Any embodiment of the present invention is optionally mounted onto or incorporated as part of an angle-walled mesa connected to the substrate, as shown in FIG. 7. The mesas used in the present invention are truncated pyramids, each having a top portion that is narrow relative to its bottom portion such that light is directed via reflection off of the mesa side walls 152 from its top portion to its bottom portion. Use of a mesa structure 150 minimizes the microcavity effect resulting from the resonance of blue and red light in the cavity defined by layers 125 and 130 in FIG. 2, for example. One of the possible problems associated with the microcavity effect is that different colors are visible to a viewer depending on the viewing angle. Use of mesa structure 150 as shown in FIG. 7 minimizes this effect by blending spectra into a forward direction. The mesa structure provides the further benefits of minimizing waveguiding within substrate 111 and avoiding cross-pumping between adjacent pixels, thereby enhancing device efficiency.

The walls 152 of mesa structure 150 are configured at any acute angle relative to the substrate, although 35°–45° is preferred. The material used for mesa structure 150 is any suitable dielectric material, such as SiO$_x$ or polytetrafluorethylene. The walls 152 of mesa structure 150 are preferably roughened to create a diffuser. In addition, the walls 152 of mesa structure 150 optionally include reflectors 151. Reflectors 151 are made of any suitable material such as Al, Ag, Mg/Al and the like. In addition to serving as reflectors, reflectors 151 are preferably electrically connected to at least one conductive layer within the devices of the present invention such that reflectors 151 may be used as electrical interconnects positioned between adjacent mesas. When used as electrical interconnects on mesa side walls 152, reflectors 151 are hidden from the viewer such that the resulting display does not have the dark lines between adjoining pixels as are frequently found in conventional display devices. The use of reflectors 151 as electrical interconnects is further described in Ser. No. 08/789,319 (filed Jan. 23, 1997), entitled "Displays Having Mesa Pixel Configuration", which is incorporated herein by reference.

Figure 8:
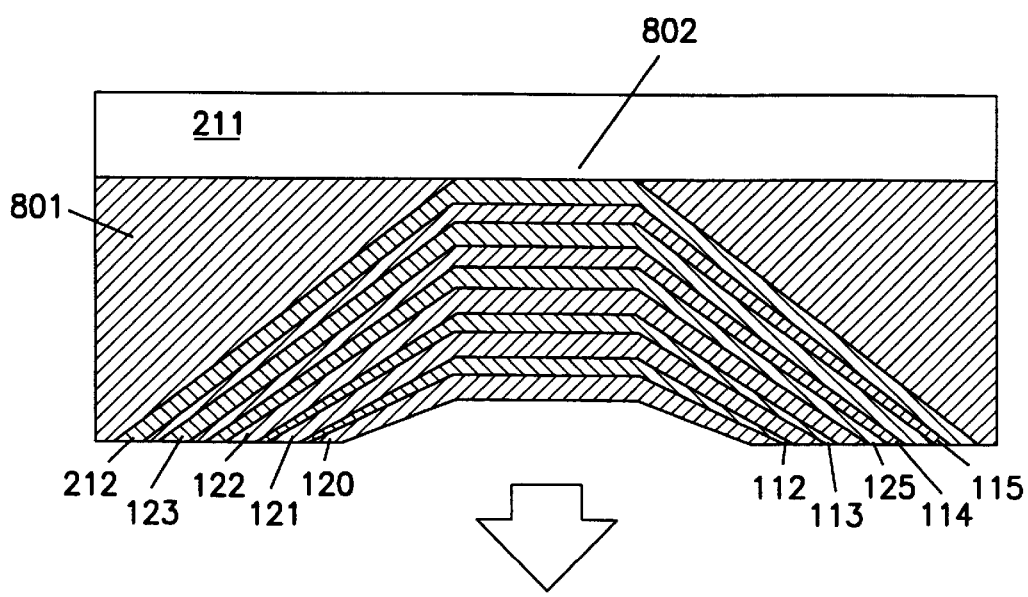
FIG. 8 is a cross sectional view of a stacked light emitting device including an inverted mesa structure, in accordance with an embodiment of the present invention.

When a mesa structure is used in conjunction with an inverted device of the present invention, the device is arranged as shown in FIG. 8, for example. To form the structure shown in FIG. 8, a layer of dielectric material 801 such as SiOx, SiNx, polyimide, etc. is deposited onto substrate 111 and etched to form at least one flat-bottom pit 802. Alternatively, inverted mesas can be formed by using a patterned substrate having at least one pit therein, each pit having a substantially flat bottom surface and slanted side walls. Each side wall is slanted so as to create any suitable obtuse angle with the bottom surface, although 135°–145° is preferred. The depth of the pit can be relatively shallow, on the order of 1000–3000 Å, and as wide as desired. For example, a suitable patterned substrate is made of Si having the pits therein formed by a standard directional etching process (e.g., reactive ion etching with the substrate held at an angle to the ion direction). In addition to the pit structure shown in FIG. 8, which has straight, slanted side walls, other cross-sections are also possible. For example, pits having a semicircular cross-section, for example, are within the scope of the present invention. Additionally, the mesas or inverted mesas of any embodiment of the present invention can be arranged, from a top view, in virtually any shape such as triangles, circles, hexagons, and preferably squares.

Once a suitable pit has been formed by either etching dielectric material deposited onto a substrate or by a patterned substrate, the arrangement of layers as shown in FIG. 6 is deposited into the pit to form an inverted device as shown in FIG. 8, for example. In the specific embodiment shown in FIG. 8, the device should be rotated about all axes during deposition to yield uniform films.

The embodiment shown in FIG. 8 is generally capable of higher resolutions than the embodiment shown in FIG. 7. This is because the embodiment shown in FIG. 7 typically results in a relatively broad light beam due to the relatively large distance between the light emitting regions and the substrate surface. In comparison, the light beam emitting from the inverted mesa structure of FIG. 8 does not pass through substrate material. The result is that relatively narrow light beams emit from inverted mesa devices when compared to those light beams emitted from the mesa device shown in FIG. 7.

Blue light emitting layers 112 and 115 used in any embodiment of the present invention are made from any suitable light emissive organic compounds such as, for example trivalent metal quinolate complexes, Schiff base divalent metal complexes, metal acetylacetonate complexes, metal bidentate ligand complexes, bisphosphonates, metal maleontriledithiolate complexes, molecular charge transfer complexes, aromatic and heterocyclic polymers and rare earth mixed chelates.

The metal bidentate complexes which may be used for layer 20 have the formula MDL$^4{}_2$ wherein M is selected from trivalent metals of Groups 3–13 of the Periodic Table and Lanthanides. The preferred metal ions are Al$^{+3}$, Ga$^{+3}$, In$^{+3}$ and Sc$^{+3}$. D is a bidentate ligand such as 2-picolylketones, 2-quinaldylkentones and 2-(o-phenoxy)

pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu) phenol; 2,6-di(t-bu) phenol; 2,6-di(t-bu) cresol; and $H_2Bpz_2$. By way of example, the wavelength resulting from measurement of photoluminescence in the solid state of aluminum (picolymethylketone) bis [2,6-di(t-bu) phenoxide] is 420 nm. The cresol derivative of this compound also measured 420 nm. Aluminum (picolylmethylketone) bis (OsiPh$_3$) and scandium (4-methoxy-picolylmethylketone) bis (acetylacetonate) each measured 433 nm, while aluminum [2-(O-phenoxy) pyridine] bis [2,6-di(t-bu) phenoxide] measured 450 nm.

Green light emitting layer 113 is made from any suitable green light emissive organic compound, such as, for example, tin (iv) metal complexes, such as those having the formula $SnL^1{}_2L^2{}_2$ where $L^1$ is selected from salicylaldehydes, salicyclic acid or quinolates (e.g. 8-hydroxyquinoline). $L^2$ can be substituted and unsubstituted alkyl, aryl and heterocyclic groups. When $L^1$ is a quinolate and $L^2$ is a phenyl, for example, the tin (iv) metal complex will have an emission wavelength of 504 nm.

The red and green downconversion phosphor media used in the present invention are well known in the art. U.S. Pat. Nos. 4,769,292 and 5,294,870, the disclosures of which are hereby incorporated by reference, are illustrative. These phosphor dyes can be dissolved in matrix polymer such as polymethylmethacrylate. Examples of red fluorescent dyes are 4-dicyano-methylene-4H-pyrans and 4-dicyanomethylene-4H-thiopyrans. Examples of green fluorescent dyes are polymethine dyes including cyanines, merocyanines, complex cyanines and merocyanines, oxonols, hemioxonols, styryls, merostyryls and streptocyanines.

The deposition techniques for any of the above-listed methods are well-known in the art. For example, the preferred method of depositing the OLED layers is by thermal evaporation (or spin coating if a single-layer polymer LED is used); the preferred method of depositing metal layers is by thermal or electron-beam evaporation; the preferred method of depositing ITO is by electron-beam evaporation or sputtering; and the preferred method of depositing phosphor layers is by sputtering.

The light emitting devices of the present invention are used to provide displays which may be divided into pixels. If so, each pixel is individually addressed such that it is able to emit red, green and blue light, either simultaneously or separately. Alternatively, when used in monochrome applications, each pixel emits a single color.

The present invention is used to provide efficient, high brightness, monochromatic or multicolor, flat panel displays of any size. The images created on such displays could be text or illustrations in full color, in any resolution depending on the size of the individual LED's. Display devices of the present invention are therefore appropriate for an extremely wide variety of applications including billboards and signs, computer monitors, telecommunications devices such as telephones, televisions, large area wall screens, theater screens and stadium screens. Embodiments of the present invention in which the emitted light is directed in a direction away from the substrate are particularly useful for xerographic applications, as such embodiments allow for close positioning to print paper without the use of lenses.

The subject invention as disclosed herein may be used in conjunction with co-pending applications: "High Reliability, High Efficiency, Integratable Organic Light Emitting Devices and Methods of Producing Same",Ser. No. 08/774, 119 (filed Dec. 23, 1996); "Novel Materials for Multicolor LED's", Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 14, 1997); "Light Emitting Devices Having High Brightness", Ser. No. 08/844,353 (filed Apr. 18, 1997) "Organic Semiconductor Laser", Ser. No. 60/046,061 (filed May 9, 1997); "Organic Semiconductor Laser", Ser. No. 08/859,468 (filed May 19, 1997); "Saturated Full Color Stacked Organic Light Emitting Devices", Ser. No. 08/858, 994 (filed May 20, 1997); "An Organic Light Emitting Device Containing a Hole Injection Enhancement Layer", Ser. No. 08/865,491 (filed May 29, 1997); "Plasma Treatment of Conductive Layers", Serial No. PCT/US97/10252 (filed Jun. 12, 1997); Patterning of Thin Films for the Fabrication of Organic Multi-Color Displays", Serial No. PCT/US97/10289 (filed Jun. 12, 1997); "Double Heterostructure Infrared and Vertical Cavity Surface Emitting Organic Lasers", Ser. No. 60/053,176 (filed Jul. 18, 1997); and "OLEDs Containing Thermally Stable Asymmetric Charge Carrier Materials", Attorney Docket No. 10020/11 (filed Sep. 8, 1997), each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

The present invention provides monochromatic and multicolor light emitting devices with high brightness and efficiency. Those with skill in the art may recognize various modifications to the embodiments of the invention described and illustrated herein. Such modifications are meant to be covered by the spirit and scope of the appended claims.

What is claimed is:

1. A light emitting device comprising:
   a substrate;
   a plurality of organic light emitting layers in a stacked arrangement over said substrate; and
   a downconversion phosphor layer disposed between any two of said plurality of organic light emitting layers.

2. The light emitting device of claim 1, further comprising a filter structure between said substrate and said downconversion phosphor layer.

3. The light emitting device of claim 2, wherein said filter structure comprises a multilayer stack of at least one dielectric material.

4. The light emitting device of claim 1, wherein said substrate is transparent.

5. The light emitting device of claim 4, wherein the light emitted from said plurality of organic light emitting layers is transmitted through said transparent substrate.

6. The light emitting device of claim 5, further comprising an angle-walled mesa structure between said substrate and said plurality of organic light emitting layers.

7. The light emitting device of claim 1, wherein said downconversion phosphor layer is a red downconversion phosphor layer.

8. The light emitting device of claim 7, wherein said red downconversion phosphor layer emits red light on absorbing blue or green light.

9. The light emitting device of claim 7, wherein the red downconversion phosphor layer comprises at least one fluorescent dye selected from the group consisting of 4-dicyanomethylene-4H-pyrans and 4-dicyanomethylene-4H-thiopyrans.

10. The light emitting device of claim 1, wherein said plurality of organic light emitting layers comprises at least one blue organic light emitting layer.

11. The light emitting device of claim 1, wherein said plurality of organic light emitting layers comprises at least one green organic light emitting layer.

12. The light emitting device of claim 1, wherein:
said plurality of organic light emitting layers comprises two blue organic light emitting layers and one green organic light emitting layer; and
said downconversion phosphor layer is a red downconversion phosphor layer.

13. The light emitting device of claim 12, wherein said substrate is transparent.

14. The light emitting device of claim 13, further comprising an angle-walled mesa structure between said substrate and said plurality of organic light emitting layers.

15. The light emitting device of claim 13, wherein:
a first of said two blue organic light emitting layers is provided over said substrate;
said green organic light emitting layer is provided over said first blue organic light emitting layer;
said red downconversion phosphor layer is provided over said green organic light emitting layer; and
a second of said two blue organic light emitting layers is provided over said red downconversion phosphor layer.

16. The light emitting device of claim 15, further comprising a filter structure disposed between said green organic light emitting layer and said red downconversion phosphor layer, said filter structure allowing the passage of red light and blocking the passage of green and blue light.

17. The light emitting device of claim 16, wherein said filter structure comprises a multilayer stack of at least one dielectric material.

18. The light emitting device of claim 16, further comprising
a first transparent conductive layer between said substrate and said first blue organic light emitting layer;
a second transparent conductive layer between said first blue organic light emitting layer and said green organic light emitting layer;
a third transparent conductive layer between said green organic light emitting layer and said filter structure; and
a fourth transparent conductive layer between said red downconversion phosphor layer and said second of said two blue organic light emitting layers.

19. The light emitting device of claim 18, wherein each of said first, second, third and fourth transparent conductive layers comprises indium-tin-oxide.

20. The light emitting device of claim 18, further comprising a metal contact layer over said second blue organic light emitting layer.

21. The light emitting device of claim 20, wherein said metal contact layer comprises a metal selected from the group consisting of magnesium, lithium, aluminum, silver, gold and alloys thereof.

22. The light emitting device of claim 18, further comprising a layer of dielectric material disposed between said first transparent conductive layer and said substrate, said dielectric material characterized by a refractive index greater than the refractive index of said first transparent conductive layer.

23. The light emitting device of claim 22, wherein said first transparent conductive layers comprises indium-tin-oxide, and said dielectric material comprises titanium dioxide.

24. The light emitting device of claim 1, wherein:
said plurality of organic light emitting layers comprises three blue organic light emitting layers; and
said downconversion phosphor layer is a red downconversion phosphor layer.

25. The light emitting device of claim 24, further comprising a green downconversion phosphor layer.

26. The light emitting device of claim 25, wherein said substrate is transparent.

27. The light emitting device of claim 26, further comprising an angle-walled mesa structure between said substrate and said plurality of organic light emitting layers.

28. The light emitting device of claim 26, wherein:
a first of said three blue organic light emitting layers is provided over said substrate;
said green downconversion phosphor layer is provided over said first blue organic light emitting layer;
a second of said three blue organic light emitting layers is provided over said green downconversion phosphor layer;
said red downconversion phosphor layer is provided over said second blue organic light emitting layer; and
a third of said three blue organic light emitting layers is provided over said red downconversion phosphor layer.

29. The light emitting device of claim 28, further comprising
a first filter structure disposed between said first blue organic light emitting layer and said green downconversion phosphor layer, said first filter structure allowing the passage of red and green light and blocking the passage of blue light; and
a second filter structure disposed between said second blue organic light emitting layer and said red downconversion phosphor layer, said second filter structure allowing the passage of red light and blocking the passage of green and blue light.

30. The light emitting device of claim 29, wherein said first and second filter structures each comprise a multilayer stack of at least one dielectric material.

31. The light emitting device of claim 29, further comprising
a first transparent conductive layer between said substrate and said first blue organic light emitting layer;
a second transparent conductive layer between said first blue organic light emitting layer and said first filter structure;
third transparent conductive layer between said green downconversion phosphor layer and said second blue organic light emitting layer;

a fourth transparent conductive layer between said second blue organic light emitting layer and said second filter structure; and a fifth transparent conductive layer between said red downconversion phosphor layer and said third blue organic light emitting layer.

32. The light emitting device of claim 31, wherein each of said first, second, third, fourth and fifth transparent conductive layers comprises indium-tin-oxide.

33. The light emitting device of claim 31, further comprising a metal contact layer over said third blue organic light emitting layer.

34. The light emitting device of claim 33, wherein said metal contact layer comprises a metal selected from the group consisting of magnesium, lithium, aluminum, silver, gold and alloys thereof.

35. The light emitting device of claim 31, further comprising a layer of dielectric material disposed between said first transparent conductive layer and said substrate, said dielectric material characterized by a refractive index greater than the refractive index of said first transparent conductive layer.

36. The light emitting device of claim 35, wherein said first conductive layer comprises indium-tin-oxide, and said dielectric material comprises titanium dioxide.

37. An electronic device incorporating the device of claim 1, said electronic device selected from the group consisting of a computer; a television; a large area wall, theater or stadium screen; a billboard; a sign; a vehicle; a printer; a telecommunication device; and a telephone.

38. A light emitting device, comprising:

a transparent substrate;

a first blue organic light emitting layer over said substrate;

a green organic light emitting layer over said first blue organic light emitting layer;

a filter structure over said green organic light emitting layer, said filter structure comprising a multilayer stack of at least one dielectric material, said filter structure allowing the passage of red light and blocking the passage of blue and green light;

a red downconversion phosphor layer over said filter structure; and a second blue organic light emitting layer over said red downconversion phosphor layer.

39. A light emitting device, comprising:

a transparent substrate;

a first blue organic light emitting layer over said substrate;

a first filter structure over said first blue organic light emitting layer, said filter structure comprising a multilayer stack of at least one dielectric material, said filter structure allowing the passage of red and green light and blocking the passage of blue light;

a green downconversion phosphor layer over said first filter structure;

a second blue organic light emitting layer over said green downconversion phosphor layer;

a filter structure over said second blue organic light emitting layer, said filter structure comprising a multilayer stack of at least one dielectric material, said filter structure allowing the passage of red light and blocking the passage of blue and green light;

a red downconversion phosphor layer over said filter structure; and a third blue organic light emitting layer over said red downconversion phosphor layer.

40. An electronic device incorporating the device of claim 38, said electronic device selected from the group consisting of a computer; a television; a large area wall, theater or stadium screen; a billboard; a sign; a vehicle; a printer; a telecommunication device; and a telephone.

41. An electronic device incorporating the device of claim 39, said electronic device selected from the group consisting of a computer; a television; a large area wall, theater or stadium screen; a billboard; a sign; a vehicle; a printer; a telecommunication device; and a telephone.

* * * * *

UNITED STATES PATENT AND TRADEMARK OFFICE
CERTIFICATE OF CORRECTION

PATENT NO. : 5,874,803
DATED : February 23, 1999
INVENTOR(S) : Garbuzov, et. al.

It is certified that error appears in the above-indentified patent and that said Letters Patent is hereby corrected as shown below:

Column 1, Line 5 change "GOVERNMENT RIGHTS" to
-- GOVERNMENT RIGHTS
This invention was made with government support under Contract No. F33615-94-1-1414 awarded by DARPA. The government has certain rights in this invention. -- .

Column 1, line 66 change "OLEDS" to -- OLEDs --.

Column 10, line 65 change "third" to -- a third --.

Signed and Sealed this

Sixteenth Day of November, 1999

Attest:

Q. TODD DICKINSON

Attesting Officer

Acting Commissioner of Patents and Trademarks